United States Patent [19]

Ehrlich et al.

[11] Patent Number: 4,567,317

[45] Date of Patent: Jan. 28, 1986

[54] EMI/RFI PROTECTED ENCLOSURE

[75] Inventors: Stephen J. Ehrlich; Edward I. Nelson, both of Sunrise, Fla.

[73] Assignee: Computer Products, Inc., Pompano Beach, Fla.

[21] Appl. No.: 511,452

[22] Filed: Jul. 7, 1983

[51] Int. Cl.$^4$ .............................................. H05K 9/00
[52] U.S. Cl. .............................. 174/35 MS; 174/35 R
[58] Field of Search ........................ 174/35 MS, 35 R; 361/424; 206/328; 220/3.8, 450

[56] References Cited

U.S. PATENT DOCUMENTS

| | | | |
|---|---|---|---|
| 1,661,535 | 3/1928 | Haddock | 455/301 |
| 1,875,968 | 9/1932 | Weeber | 174/35 MS |
| 2,219,941 | 10/1940 | Rochow | 174/35 MS |
| 2,321,587 | 6/1943 | Davie et al. | 174/35 MS |
| 2,349,440 | 5/1944 | Lavoie | 250/39 |
| 2,704,301 | 3/1955 | Feketics | 174/35 MS |
| 2,876,275 | 3/1959 | Schulz | 174/35 MS |
| 3,234,318 | 2/1966 | Van Lieshout et al. | 174/35 MS |
| 3,322,879 | 5/1967 | Lindgren | 174/35 MS |
| 3,341,102 | 9/1967 | Stephens et al. | 174/35 MS |
| 4,110,552 | 8/1978 | Lombardi | 174/35 MS |
| 4,209,215 | 6/1980 | Verma | 174/35 R X |
| 4,215,796 | 8/1980 | Johnston et al. | 220/3.8 |
| 4,218,578 | 8/1980 | Olschewski et al. | 174/35 R |
| 4,227,037 | 10/1980 | Layton | 174/35 MS |
| 4,331,285 | 5/1982 | Gottwals | 174/35 R X |

FOREIGN PATENT DOCUMENTS 304259  1/1929  United Kingdom .......... 174/35 MS

Primary Examiner—A. T. Grimley
Assistant Examiner—Morris H. Nimmo
Attorney, Agent, or Firm—Trexler, Bushnell & Wolters, Ltd.

[57] ABSTRACT

An EMI/RFI shielded housing for an electrical apparatus comprises a case member and a complementary cover member, each comprising an end wall portion and a side wall portion together defining substantially continuous and unbroken peripheral surfaces. The side wall portions of these members are respectively configured for an interference fit therebetween to define an assembled condition of the housing. This interference fit is defined by the side wall portion of the case member being received interiorally of the side wall portion of the cover member. Moreover, substantially the entire inner surfaces of the end wall portions of both case and cover member are electrically conductive, substantially the entire inner surface of the side wall portion of the case member is electrically conductive and major fractional portions of respective facing surfaces of the assembled and interference-fitted side wall portions are electrically conductive. All of these conductive surfaces are electrically coupled when the case is assembled to define a continuous shield. However, the exterior surfaces of the end wall portions of both cover and case members, the exterior side wall portions of the cover member, and minor fractional portions of the facing surfaces of the case and cover member, respectively, are electrically non-conductive.

13 Claims, 9 Drawing Figures

U.S. Patent   Jan. 28, 1986   Sheet 1 of 2   4,567,317
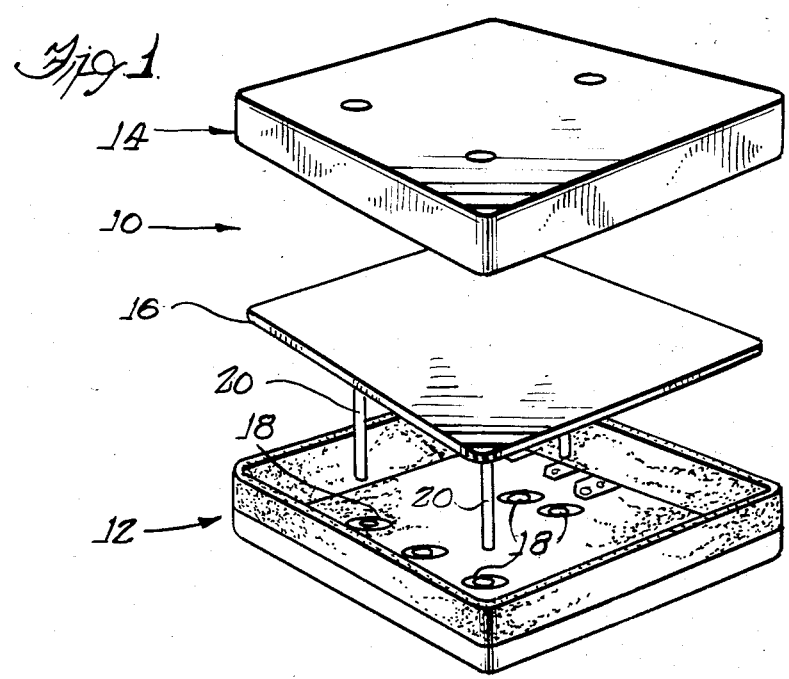
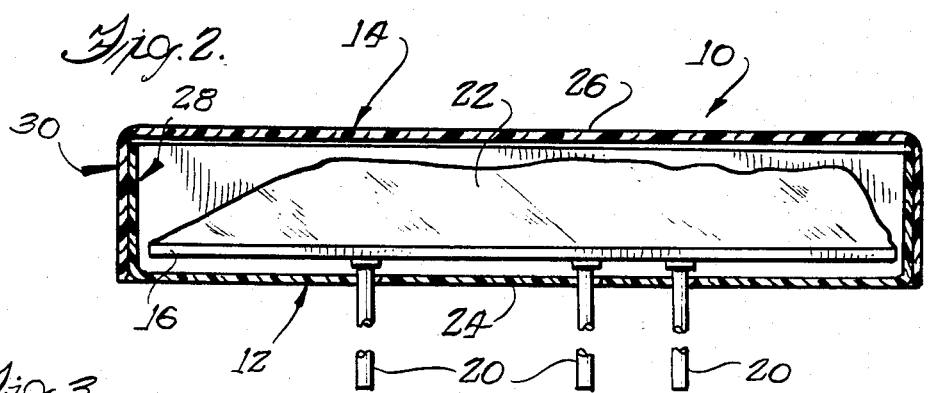
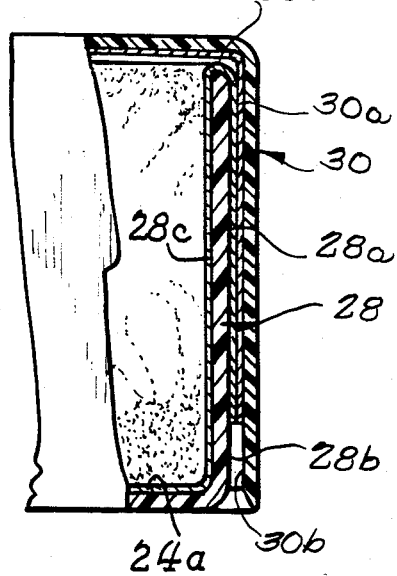
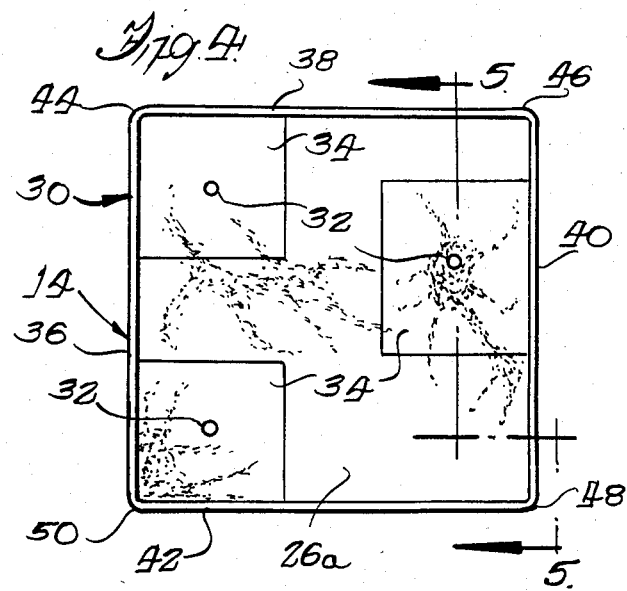

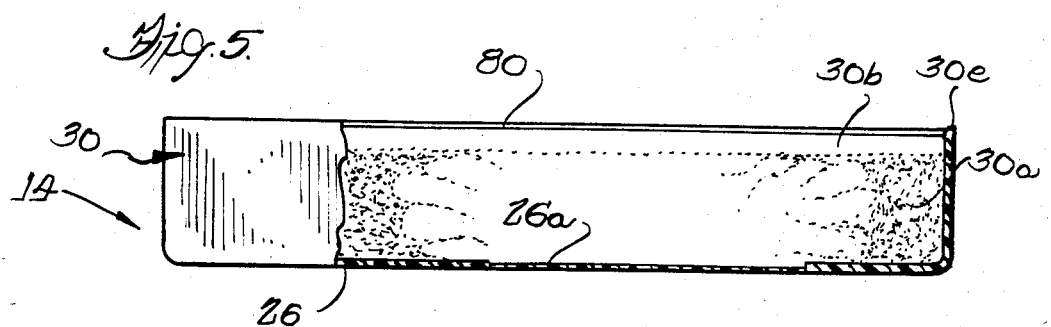
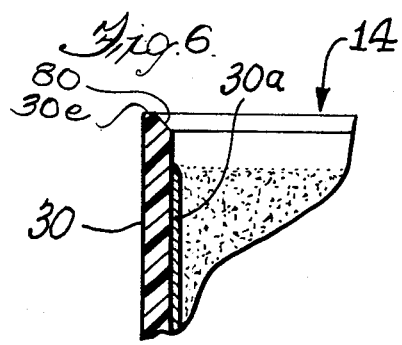
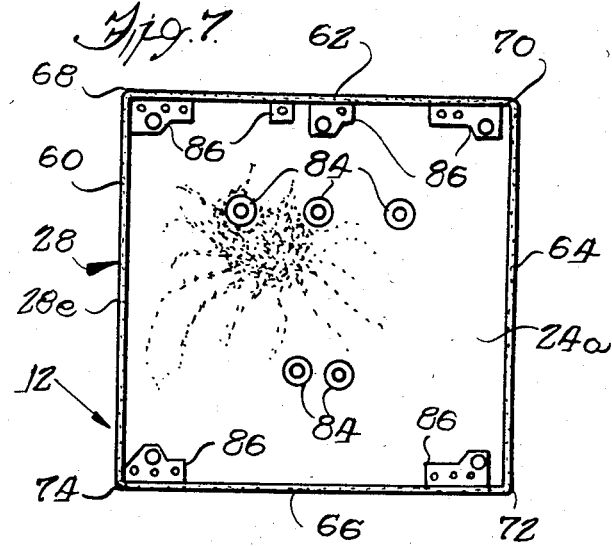
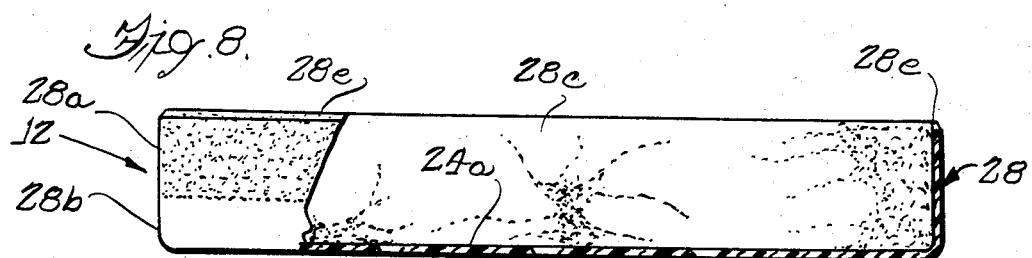
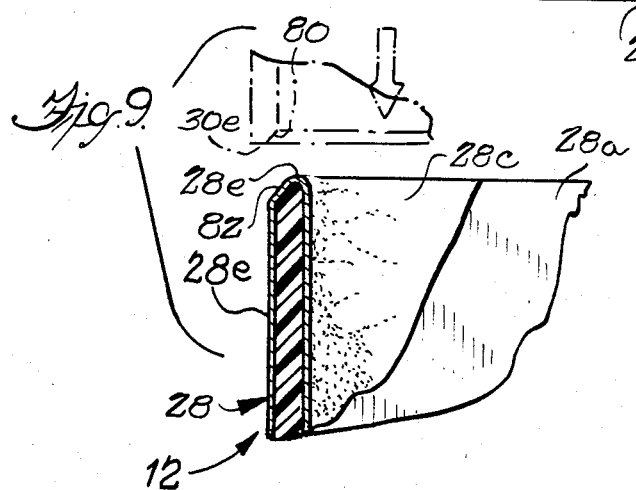

EMI/RFI PROTECTED ENCLOSURE

BACKGROUND OF THE INVENTION

This invention is directed generally to enclosures or housings for electrical or electronic apparatus and more particularly to the provision of a novel housing or enclosure which provides EMI and RFI shielding.

The problem of electromagnetic interference (EMI) and/or radio frequency interference (RFI) is well-known in the electrical and electronic arts. In this regard, many electrical and/or electronic components and/or circuits may be adversely affected by such types of interference signals. Accordingly, it is desirable to provide suitable shielding against such interference for these components and circuits. Additionally, FCC regulations, as well as other practical considerations, require that emissions of such EMI or RFI signals from various circuits and components be held below defined levels. This is to avoid interference with radio reception, or with other such interference signal-sensitive circuits and components.

The prior art has provided a number of enclosures or housings designed for shielding or screening such EMI/RFI signals. Various prior art arrangements of this type are shown, for example, in U.S. Pat. Nos. 2,219,941; 2,876,275; 3,234,318; 4,110,552 and 4,218,578. While the prior art has thus provided a number of housings or enclosures directed to the solution of this problem, there remains room for further improvement.

For example, many prior art devices consist simply of boxes or enclosures made of conductive metallic materials. However, such metallic boxes are not suitable in applications where insulated or non-conductive outer surfaces of the enclosure are required. In such situations, a second or outer housing or an additional layer of a suitable non-conductive or insulating material may be required at additional expense.

Various copper or other conductive foil-like materials have also been utilized inside or outside of such housings. However, such foil materials are very expensive to provide. In this regard, conductive coatings of metallizing materials or foils on desired surfaces of the housings or enclosures may be utilized. However, these designs have heretofore required interconnection with various spring contacts, conductive rubber or metal scraps, wires, screws and nuts, conductive epoxys or the like.

In this latter regard, reliable EMI/RFI shieldings requires that a substantially continuous and unbroken conductive surface be provided, that is that substantially no gaps exist in this surface. This presents particular problems where several components, such as covers or the like, of such enclosures must be fitted together. Additionally, it is often desirable to enclose the electrical circuits or other elements contained in the housing in a suitable potting compound. To this end, a number of relatively large openings may be required for the ingress of the potting compound, requiring later closing of these openings to maintain proper shielding. Mounting or soldering additional shielding material can be both difficult and expensive in such situations.

OBJECTS AND SUMMARY OF THE INVENTION

Accordingly, it is a general object of this invention to provide a novel and improved EMI/RFI shielded enclosure which substantially avoids the problems of the prior art.

A more specific object is to provide such an enclosure which provides a substantially continuous electrical path surrounding the enclosed circuits or elements without the need for any additional fasteners, adhesives, or other additional coupling materials or secondary operations.

A related object is to provide such an enclosure which is non-conductive about its external surfaces.

A related object is to provide an enclosure in accordance with the foregoing objects which is relatively simple and inexpensive in its design and manufacture and yet highly reliable in operation.

Briefly, and in accordance with the foregoing objects a housing for an electrical apparatus in accordance with the invention comprises a case member and a complementary cover member, each comprising an end wall portion and a side wall portion together defining substantially continuous and unbroken peripheral surfaces. The side wall portions of these members are respectively configured for an interference fit therebetween when assembled. Moreover, internally facing surface means of both case and cover member are electrically conductive, and the interference-fitted surfaces of the side wall portions are electrically conductive and electrically coupled to the internally facing surfaces. However, externally facing surface means of the case are electrically non-conductive.

BRIEF DESCRIPTION OF THE DRAWINGS

The foregoing as well as other objects, features and advantages of the invention will be more readily appreciated upon reference to the following detailed disclosure of the illustrated embodiment, together with reference to the drawings, wherein:

FIG. 1 is an exploded perspective view illustrating assembly of an electrical circuit with a novel housing in accordance with the invention;

FIG. 2 is a sectional view through an assembled circuit and housing in accordance with the invention;

FIG. 3 an enlarged view of a portion of the assembled housing of FIG. 2;

FIG. 4 is a plan view of one housing member or half in accordance with the invention;

FIG. 5 is a side elevation, partially broken away and partially in section of the housing member or half of FIG. 4;

FIG. 6 is an enlarged view of a portion of the housing member or half of FIGS. 4 and 5;

FIG. 7 is a plan view of another second housing member or half in accordance with the invention;

FIG. 8 is a side elevation, partially in section and partially broken away of the housing member or half of FIG. 7; and FIG. 9 is an enlarged view of a portion of the housing member or half of FIGS. 8 and 9.

DETAILED DESCRIPTION OF THE ILLUSTRATED EMBODIMENT

Referring now to the drawings and initially to FIG. 1, a novel EMI/RFI protected enclosure in accordance with the invention is designated generally by the reference numeral 10. This enclosure 10 comprises a first shell or case member designated generally 12 and a complementary second shell or cover member designated generally 14.

In the illustrated embodiment the enclosure or housing comprising the case 12 and cover 14 is utilized to provide EMI/RFI protection to a circuit or other electrical or electronic component mounted to a conventional circuit board 16. In the exemplary embodiment shown, one or more through openings or knock-outs 18 may be provided in the case member to receive suitable mounting posts 20 associated with the circuit board 16. In this regard, suitable electrical leads to the circuit or other components (not shown) mounted to the board 16 may also be fed out by way of through apertures preferably provided in the form of the hollow interiors of mounting posts 20, which are preferably generally tubular in configuration.

Referring briefly to FIG. 2, the assembled condition of the housing halves 12 and 14 of FIG. 1 about the circuit mounted to board 16 is illustrated. It will be noted that in addition to the components illustrated in FIG. 1, a quantity of potting compound 22 may be provided to encapsulate the circuit mounted to the board 16. In this regard, the invention advantageously permits initial mounting of the circuit board 16 and mounting members 20 with the case 12, whereupon a quantity of potting compound 22 may be added as desired. Thereafter, the complementary cover member 14 is fitted over the case 12 as illustrated in FIGS. 1 and 2 to complete the enclosure or housing assembly.

The respective case and cover member 12, 14 will be noticed to each comprise a suitable end wall portion 24, 26, respectively, from which extend generally complimentarily configured circumferential side wall portions 28 and 30, respectively. In the illustrated embodiment, these respective housing halves are generally rectilinear in configuration, although the invention is not so limited. Importantly, however, the respective side wall portions 28 and 30 are configured to form an interference fit therebetween when assembled as illustrated in FIG. 2. In this regard, the side wall portion 28 of case member 12 is preferably sized and configured to be received with an interference fit within the inwardly facing surface of the side wall portion 30 of cover member 14.

In accordance with a feature of the invention, the inner or inwardly facing surfaces of the case 12 and cover 14, respectively, are electrically conductive. However, the externally facing surfaces of these same members, when the housing is assembled as illustrated in FIG. 2, present electrically non-conductive surfaces.

Furthermore, and referring briefly to FIG. 3, a major fractional portion 30a of the inwardly facing surface of side wall 30 is also electrically conductive, as is a major fractional portion 28a of the outwardly facing surface of side wall 28. It will be noted that the conductive coatings which define these conductive surfaces may be as thin as 0.00001 in., whereby the showing thereof in FIG. 3 has been greatly exaggerated to facilitate the present description. Moreover, these respective electrically conductive surfaces 28a and 30a extend substantially continuously about the peripheries of these mutually facing interference-fitted surfaces of the respective side walls 28 and 30. Advantageously, the interference fit mentioned above between these surfaces 28a and 30a provides a substantially continuous and unbroken metal-to-metal contact and electrical connection between conductive surfaces 28a and 30a about their entire extent. Moreover, an edge portion 28e of the case 28 is also electrically conductive, thereby electrically joining the interior surfaces thereof with the surface 28a. The foregoing features advantageously provide simple and yet effective EMI/RFI shielding for the enclosure or housing 10.

However, as previously indicated, the external surfaces of the assembled housing 10 are electrically non-conductive or of an insulative nature. Hence, the housing may be readily mounted in the vicinity of other electrically conductive components or the like, without fear of shorting or arcing or the like therebetween. In this regard, to preserve the non-conductive properties of the exterior of assembled housing 10, minor fractional portions 28b, 30b of the interference-fitted side walls are maintained non-conductive.

Referring now to the remaining drawings in additional detail, further preferred features of the illustrated embodiment will now be described. The cover member, illustrated in FIGS. 4–6 is, as previously mentioned, of generally rectilinear configuration in the illustrated embodiment. Hence, a generally rectangular end wall 26 supports a side wall 30 made up of four similar side wall segments 36, 38, 40, 42 respectively joined by generally curvilinear corner segments 44, 46, 48, 50. In this regard, the end wall 26 and side wall 30 thus define a substantially continuous and unbroken surface. However, one or more through openings 32 may be provided, as previously mentioned to permit the running of electrical leads or the like to and from the components contained on the circuit board 16. Additionally in this regard, the cover 14 in the illustrated embodiment is provided with suitable depressed or recessed areas 34 about the interior surface thereof to provide additional clearance for circuit components which may be mounted to the circuit board 16.

In accordance with the invention, the cover member 14, as well as the case 12, are preferably made from a suitable electrically non-conductive and moldable resilient plastic material. Further in accordance with a preferred form of the invention the previously mentioned conductive surfaces of both cover and case take the form of a metallic coating, preferably deposited by a metallization process. In this regard, and referring to FIGS. 4 through 6, the cover 14 receives such a coating or metallization over substantially the entire inner surface of the end wall 26, as indicated at reference numeral 26a, as well as about a major fractional portion of the inner surfaces 30a of the side wall 30 as previously mentioned. These conductive surfaces are substantially electrically coupled or continuous to assure continuity of the shielding provided thereby.

In accordance with a preferred form of the invention a minor fractional outer portion 30b of the interior surface of side walls 30 is masked prior to the coating or metallization process so that it remains uncoated and therefore electrically non-conductive.

Cooperatively, a like minor fractional portion 28b (see FIG. 3) of the outwardly facing surface of side wall 28 of case 12 also is masked during the coating process. Advantageously, the foregoing uncoated minor fractional portions assure that substantially no conductive material or metallic coating material will extend outwardly of the assembled housing 10 as viewed in FIG. 2, thus assuring that substantially the entire external surface thereof remains electrically non-conductive as previously described.

Referring now to FIGS. 7, 8 and 9, the case 12, as previously mentioned is preferably a generally rectilinear member comprising a generally rectangular end wall 24 and side wall 28. In order to form a complementary fit with side wall 30 of the cover 14, the side wall 28 similarly comprises four similar side wall segments 60, 62, 64 and 66 joined by four similar generally curvilinear corner portions 68, 70, 72 and 74.

As previously indicated, substantially the entire interior surface portion of both the end wall 24 and the side wall 28 are rendered electrically conductive by coating or metallizing in the same fashion as described above. These surfaces are indicated generally by reference numeral 24a and 28c, respectively. As also previously indicated a major fractional portion of the exteriorly facing surface and a leading edge surface of the side wall 28 are also coated or metallized in the same fashion as generally indicated by reference numerals 28a and 28e. However, a minor fractional portion 28b adjacent the end wall 24 is not so coated as previously indicated. These surfaces 24a, 28a, 28c and 28e also substantially electrically coupled or continuous to assure continuity of the shielding provided thereby. In this regard, the preferred metallizing process is particularly advantageous in assuring coating of even relatively irregular surfaces, such as edge 28e.

In accordance with a preferred form of the invention, respective leading edge portions 28e and 30e of the respective side walls 28 and 30 are also provided with complementary lead-in surfaces to facilitate initial alignment and engagement therebetween. Referring particularly to FIGS. 6 and 9, it will be seen that the leading edge portion 30e is provided with an inwardly beveled surface or chamfer 80. Cooperatively, the leading edge surface 28e is provided with a complementary outwardly facing bevel or chamfer 82.

In the illustrated embodiment, as best viewed in FIG. 7, the case member 12 may further be provided with a plurality of pre-formed areas suitable for use as knock-outs, to accommodate various configurations of circuit components and their attendant mounting requirements, as well as through apertures for mounting members or connecting leads or the like as previously mentioned. These pre-formed areas are preferably left uncoated or unmetallized in the illustrated embodiment to prevent possible damage or cracking of the surrounding coating when such pre-formed areas are knocked out for use with particular circuit components. These areas are designated generally in FIG. 7 by the reference numerals 84, 86.

As previously indicated, the respective housing halves or case in cover are preferably constructed of a moldable resilient plastic material, whereby a certain degree of give or flexibility is realized in the respective side wall members 28, 30. That is, the respective side walls 28 and 30 are preferably capable of some elastic movement with respect to the end walls 24, 26 from which they extend.

Advantageously, this resiliency provides enhancement in the way of spring-like loading of the interference fit between the respective side wall portions for promoting a more secure electrical connection between the two parts of the housing without the aid of secondary fasteners or connecting operations.

What has been illustrated and described herein is a novel and improved EMI/RFI protected enclosure or housing. While the invention has been illustrated and described herein with reference to a specific embodiment, the invention is not limited thereto. Those skilled in the art may devise various changes, alternatives and modifications. Such changes, alternatives and modifications form a part of the invention insofar as they fall within the spirit and scope of the appended claims.

The invention is claimed as follows:

1. A housing for providing EMI/RFI shielding for an electrical apparatus, comprising: complementary first and second shell members each including an end wall portion and an integrally formed circumferential side wall portion; each said side wall portion defining a substantially continuous and unbroken peripheral surface; the side wall portion of the second shell member being configured for an interference fit with said first shell member side wall portion; substantially the entire internally facing surfaces of both of said first and second shell members being electrically conductive for providing effective EMI/RFI shielding; substantial portions of the respective interference-fitted surfaces of said first and second shell members also being electrically conductive in a continuous fashion thereabout; electrically conductive means forming substantially continuous and uninterrupted electrical connections respectively between the interference-fitted surfaces and the internally facing surfaces of each of said shell members for defining continuity of said shielding; and substantially the entire externally facing surfaces of said first and second shell members being electrically non-conductive.

2. A housing according to claim 1 wherein each said side wall portion is resiliently movable with respect to the associated end wall whereby said interference fit is further enhanced by spring-like loading of the respective side wall portions.

3. A housing according to claim 1 wherein leading edge portions of each of said side wall portions are provided with complementary lead-in surfaces to facilitate initial alignment and engagement therebetween.

4. A housing according to claim 1 wherein said first and second shell members are constructed of an electrically non-conductive material and wherein the respective electrically conductive surfaces thereof are defined by an electrically conductive coating means applied thereto.

5. A housing according to claim 4 wherein said coating means comprises a metallizing material applied to said electrically conductive surfaces.

6. A housing according to claim 4 wherein said electrically non-conductive material comprises a moldable plastic material.

7. A housing according to claim 6 wherein said conductive coating material comprises a metallizing material.

8. A housing according to claim 1 where both of said first and second shell members are generally rectilinear in configuration.

9. A housing according to claim 8 wherein said depending side wall portions define generally rectangular peripheries, each comprising four side wall segments respectively interconnected by curvilinear corner segments.

10. A housing according to claim 3 wherein said lead-in surfaces comprise complementary chamfers on the respective leading edge portions of said first and second side wall portions.

11. A housing according to claim 10 wherein the complementary chamfers comprise an inwardly beveled surface on the side wall portion leading edge of one of said shell members and a complementary outwardly beveled surface on the leading edge of the peripheral wall of the other of such shell members.

12. A housing for an electrical apparatus comprising: a case member and a complementary cover member, each comprising an end wall portion and a side wall portion together defining substantially continuous and unbroken peripheral surfaces; the side wall portions being respectively configured for an interference fit therebetween; said interference fit being defined by the side wall portion of the case member received interiorally of the side wall portion of the cover member; wherein substantially the entire inner surfaces of the end wall portions of both said case and said cover member are electrically conductive, and wherein substantially the entire inner surface of the side wall portion of the case member is electrically conductive and major fractional portions of respective facing surfaces of the respective interference-fitted side wall portions are electrically conductive in a continuous fashion thereabout; said housing further comprising electrically conductive means forming substantially continuous and uninterrupted electrical connections respectively between the interference-fitted surfaces and the inner surfaces of each of said members for promoting continuity of said shielding; and wherein the exterior surfaces of end wall portions of both said cover and said case member, the exterior side wall portions of said cover member, and minor fractional portions of the facing surfaces of said case and cover member, respectively, are electrically non-conductive.

13. A housing according to claim 12 wherein the respective side wall portions of said cover and said case member define complementary configurations substantially about the entire peripheries thereof to thereby interfit in an interference fit substantially about the entire peripheries thereof.

* * * * *